(12) United States Patent
Mouli et al.

(10) Patent No.: US 7,960,765 B2
(45) Date of Patent: Jun. 14, 2011

(54) METHOD AND APPARATUS FOR PROVIDING AN INTEGRATED CIRCUIT HAVING P AND N DOPED GATES

(75) Inventors: Chandra Mouli, Boise, ID (US); Kunal R. Parekh, Boise, ID (US)

(73) Assignee: Aptina Imaging Corporation, George Town (KY)

( * ) Notice: Subject to any disclaimer, the term of this patent is extended or adjusted under 35 U.S.C. 154(b) by 80 days.

(21) Appl. No.: 12/467,896

(22) Filed: May 18, 2009

(65) Prior Publication Data

US 2009/0224299 A1      Sep. 10, 2009

Related U.S. Application Data

(62) Division of application No. 11/327,377, filed on Jan. 9, 2006, now Pat. No. 7,544,533.

(51) Int. Cl.
*H01L 31/062*       (2006.01)
(52) U.S. Cl. .................. 257/291; 257/292; 257/E27.133
(58) Field of Classification Search .................. 257/292, 257/431, 443, E27.132, 291, 293, 294, E27.13, 257/E27.133, E27.141
See application file for complete search history.

(56) References Cited

U.S. PATENT DOCUMENTS

| 5,989,962 | A | 11/1999 | Holloway et al. |
| 6,329,233 | B1 * | 12/2001 | Pan et al. ...................... 438/199 |
| 6,465,786 | B1 | 10/2002 | Rhodes |
| 6,734,113 | B1 | 5/2004 | Cho et al. |
| 6,821,833 | B1 | 11/2004 | Chou et al. |
| 6,879,340 | B1 | 4/2005 | Chevallier |
| 6,908,839 | B2 | 6/2005 | Rhodes |
| 2003/0086011 | A1 | 5/2003 | Wu et al. |
| 2003/0157772 | A1 | 8/2003 | Wieczorek et al. |
| 2004/0051123 | A1 | 3/2004 | Rhodes |
| 2004/0102010 | A1 | 5/2004 | Khamankar et al. |
| 2006/0043369 | A1 * | 3/2006 | Varghese et al. ................. 257/69 |

FOREIGN PATENT DOCUMENTS

KR      10-2006-0010949 A      2/2006

OTHER PUBLICATIONS

T. Ohguro et al., The Impact of Oxynitride Process, Deuterium Annealing and STI Stress to 1/f Noise of 0.11 µm CMOS, 2003 Symopsium on VLSI Technology Digest of Technical Papers.
T. Ohguro, et al., A Study of Analog Characteristics of CMOS with Heavily Nitrided NO Oxynitrides, 2001 Symposium on VLSI Technology Digest of Technical Papers.
Moon, Chang-Rok et al., "The features and characteristics of 5M CMOS image sensor with 1.9X1.9µm$^2$ pixels," IEEE Electron Devices Meeting, IEDM Technical Digest, Dec. 5-7, 2005, IEEE International.
Form PCT/ISA/206 and Annex to Form PCT/ISA/206—Communication Relating to the results of the Partial International Search, dated Jun. 20, 2007.

* cited by examiner

*Primary Examiner* — Brook Kebede

(57) ABSTRACT

A method and apparatus providing an integrated circuit having a plurality of gate stack structures having gate oxide layers with differing thicknesses and nitrogen concentrations and gate electrodes with differing conductivity types and active dopant concentrations.

26 Claims, 11 Drawing Sheets

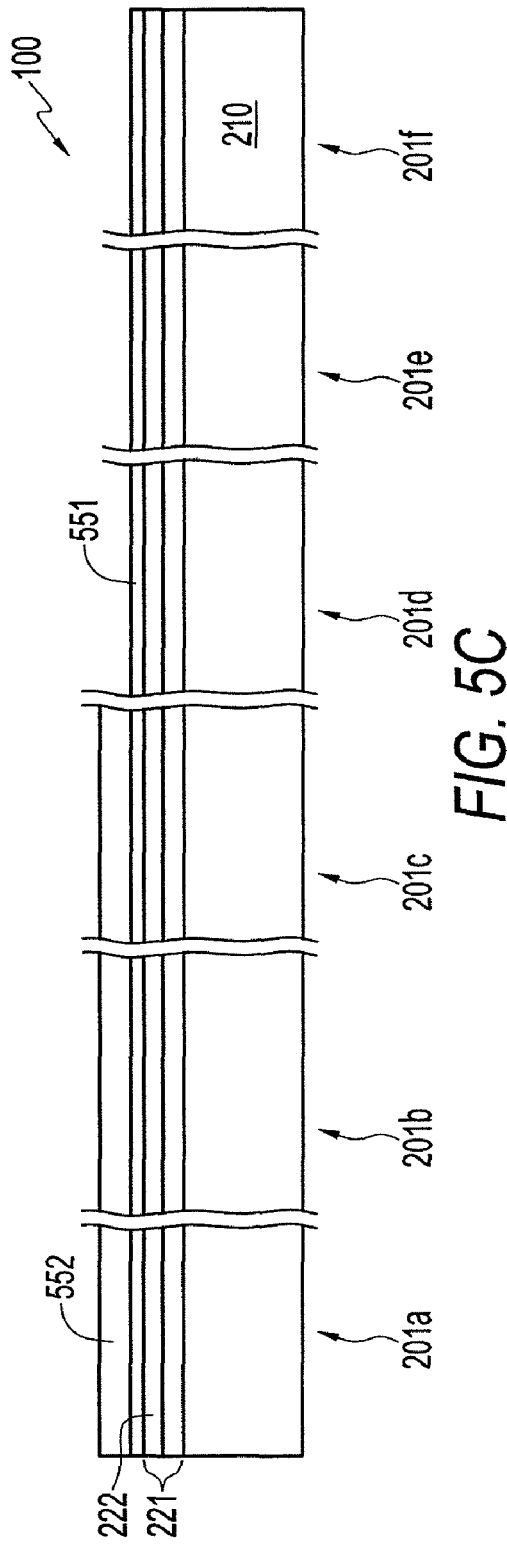
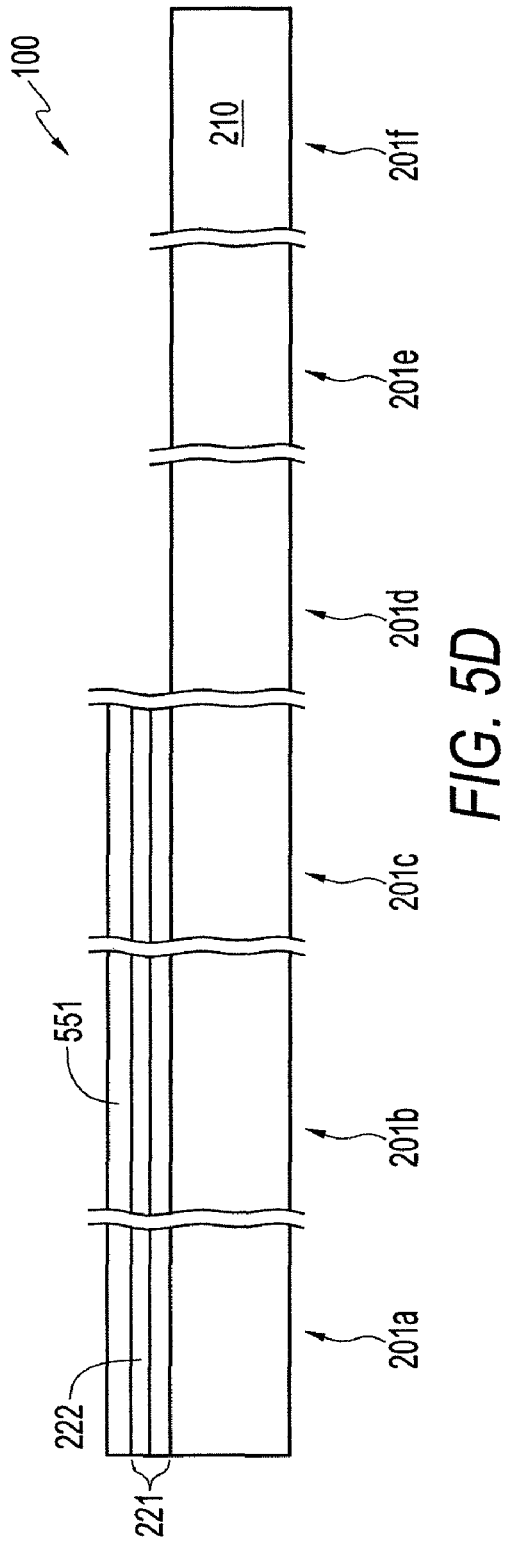
FIG. 5C
FIG. 5D

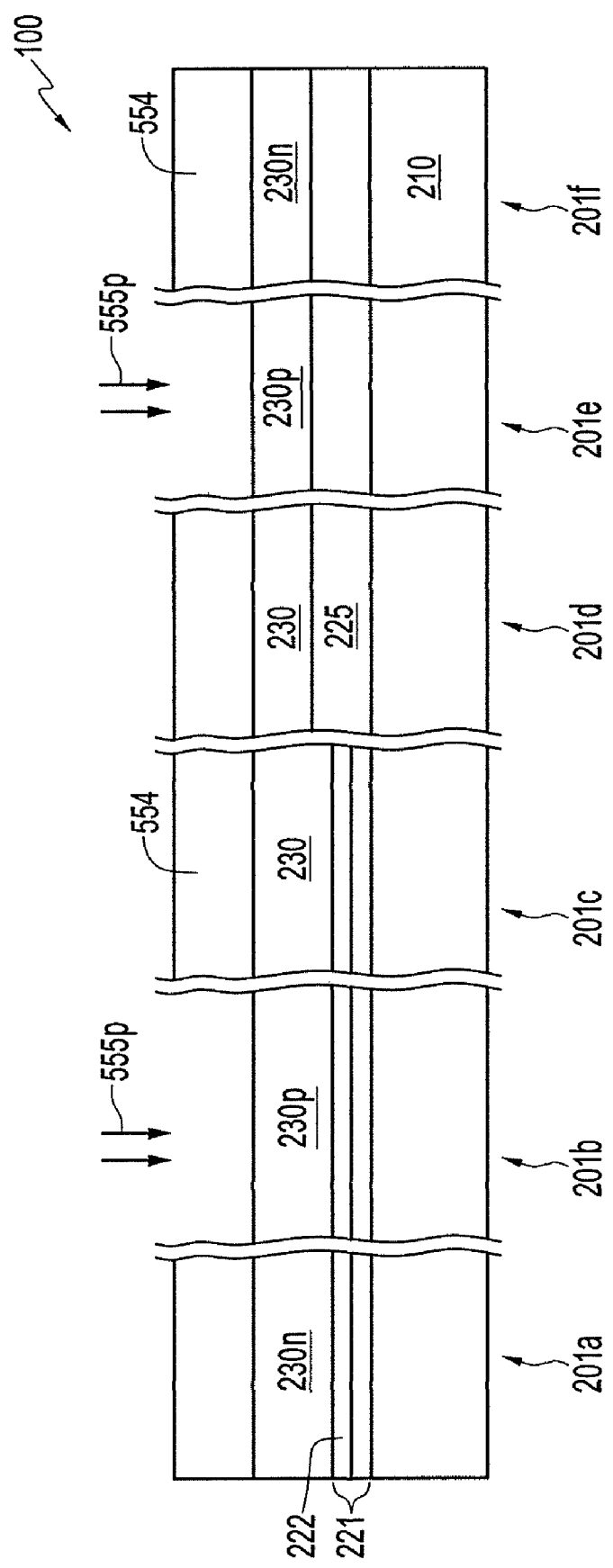

METHOD AND APPARATUS FOR PROVIDING AN INTEGRATED CIRCUIT HAVING P AND N DOPED GATES

This application is a divisional of U.S. patent application Ser. No. 11/327,377, filed on Jan. 9, 2006 now U.S. Pat. No. 7,544,533, which is hereby incorporated herein by reference in its entirety.

FIELD OF THE INVENTION

The invention relates to semiconductor devices and systems. In particular, the invention relates to a method and apparatus providing n and p-type gate structures.

BACKGROUND OF THE INVENTION

For high speed circuitry it is desirable to have devices, such as transistors, with both p and n-type gates to allow for smaller device sizes while enabling the high speeds. For example, in DRAM processes, both p+ and n+ gate electrodes are used to allow both high speed processing and smaller sizes.

Many system-on-chip (SOC) designs include both high speed digital circuitry and analog circuitry. Image sensors are examples of apparatuses that can have an SOC design. Image sensors typically include an array of pixel cells and peripheral circuitry for signal processing. Ideally, image sensors would be capable of analog signal processing in addition to high speed digital processing. High speed image sensor circuitry requires small gate length devices compatible with high drive currents and low threshold voltages, whereas analog signal transmitters, particularly in a pixel array, have much different operating characteristics where high quantum efficiency is more important than speed. This is true for both PMOS and NMOS devices.

Conventional NMOS devices use n+ polysilicon gate electrodes over a substrate having a p-well. Such devices are surface channel devices. If the same n+ polysilicon gate electrode is used in connection with an n-well in a PMOS device, the threshold voltage becomes too high. However, using n+ gates throughout an image sensor or any other integrated circuit is a low cost process. To accommodate n+ gate electrodes in PMOS devices, a p-type implant is used at the substrate n-well surface to create a buried junction in the channel region of the transistor. Using a "buried channel" PMOS device has significant drawbacks. For example, such a device does not scale down to smaller sizes well, due to poor electrostatic gate control and, therefore, poor short-channel effects.

It would be desirable to use both p+ and n+ gate electrodes having different operating characteristics in integrated circuits. However, conventional methods for fabricating integrated circuits having both p+ and n+ gate electrodes is not well suited for providing both p+ and n+ gate electrodes each having different operating characteristics in a single integrated circuit. One of the biggest challenges in the process flow used to fabricate both p+ and n+ gate electrodes is to keep the dopant types, particularly p-type dopants, such as boron, from diffusing through the gate oxide into the channel regions of the devices during the thermal processing steps. N-type dopants, such as phosphorus and arsenic, have relatively low diffusivity through oxides and therefore, are not a primary concern. To address this problem, it has become standard to uniformly use nitrided gate oxides when both p+ and n+ gate electrodes are used.

Nitrided gate oxides, however, are known to have significant disadvantages, particularly in noise sensitive integrated circuits such as image sensors. For example, when a nitrided gate oxide is used, the interface between the gate oxide and substrate surface is poor. Further, nitrided oxides cause fluctuation in transistor characteristics, such as carrier mobility, transconductance, trapping, de-trapping, among others, which are undesirable in analog circuitry. Additionally, nitrided gate oxides used in pixels significantly increases noise, particularly "1/f" or random telegraph signal "RTS" noise in image sensors, which is undesirable.

What is needed is a method and apparatus which mitigates the drawbacks noted with conventional nitrided gates, but which provides an integrated circuit, e.g., and image sensor integrated circuit, with n and p-type gates and with different types of n and p-type gates in an integrated circuits. Additionally, it is desirable to have a variety of devices having different threshold voltages for use in circuit designs.

BRIEF SUMMARY OF THE INVENTION

Embodiments of the invention provide methods and apparatuses for an integrated circuit having a plurality of gate stack structures having gate oxide layers with differing thicknesses and/or nitrogen concentrations; and gate electrodes with differing conductivity types and/or active dopant concentrations. The method is suited for forming an image sensor having both analog transistors and transistors for high speed digital processing without increased noise.

A first oxide layer is formed on a substrate for a first plurality of gate structures to be located over a first area of the substrate. A nitridation process is conducted to form a first nitrided oxide layer from at least a portion of the first oxide layer. Portions of the first oxide layer and first nitrided oxide layer over at least a second area of the substrate are removed. A second oxide layer is formed on the substrate in at least the second area. A conductive layer is formed over the first nitrided oxide layer and the second oxide layer in the first and second areas. In the first area, the first oxide layer, the first nitrided oxide layer and the conductive layer are patterned to form a first plurality of gate stacks for a first plurality of devices. In the second area, the second oxide layer and the conductive layer are patterned to form a second plurality of gate stack for a second plurality of devices. Within at least one of the first and second areas, the conductive layer is doped to at least one of a first and second conductivity type.

BRIEF DESCRIPTION OF THE DRAWINGS

FIGS. 5A-5I depict the formation of the image sensor of FIG. 1 at different stages of processing.

DETAILED DESCRIPTION OF THE INVENTION

This invention provided p and n-type gate structures in a single integrated circuit. Although this invention will be described in terms of certain exemplary embodiments, such as a CMOS image sensor, the invention is not limited to such exemplary embodiments. Accordingly, the scope of the invention is defined only by reference to the appended claims.

The term "substrate" is used in the following description to refer to any supporting layer suitable for fabricating an integrated circuit, typically semiconductor based, but not necessarily so. A substrate may be silicon-based, may include epitaxial layers of silicon supported by a base semiconductor or non-semiconductor foundation, can be sapphire-based, silicon-on-insulator (SOI), metal, polymer, or any other suitable materials. When reference is made to a substrate in the following description, previous process steps may have been utilized to form regions, junctions or other structures in or over a base semiconductor or other foundation.

Exemplary embodiments of the invention are described with respect to an image sensor having an array of imaging pixels and associated image acquisition and processing circuit. The term "pixel" refers to a photo-element unit cell containing a charge accumulating photo-conversion device and associated transistors for converting electromagnetic radiation to an electrical signal. The pixels discussed herein are illustrated and described as 4 T (4 transistors) CMOS pixel circuits for the sake of example only. It should be understood that the invention is not limited to a four transistor (4 T) pixel or even to CMOS technology, but may be used with other pixel arrangements having fewer (e.g., 3 T) or more (e.g., 5 T) than four transistors and other imager technology, for example, charge coupled devices (CCD). Although the invention is described herein with reference to the architecture and fabrication of one pixel, it should be understood that this is representative of a plurality of pixels as typically would be arranged in an imager array having pixels arranged, for example, in rows and columns. The following detailed description is, therefore, not to be taken in a limiting sense, and the scope of the present invention is defined only by the appended claims.

Additionally, while exemplary embodiments of the invention are described in connection with image sensors, the invention is not so limited. The invention is applicable to other integrated circuit devices and systems, which might employ p and n-type gate structures.

Figure 1:
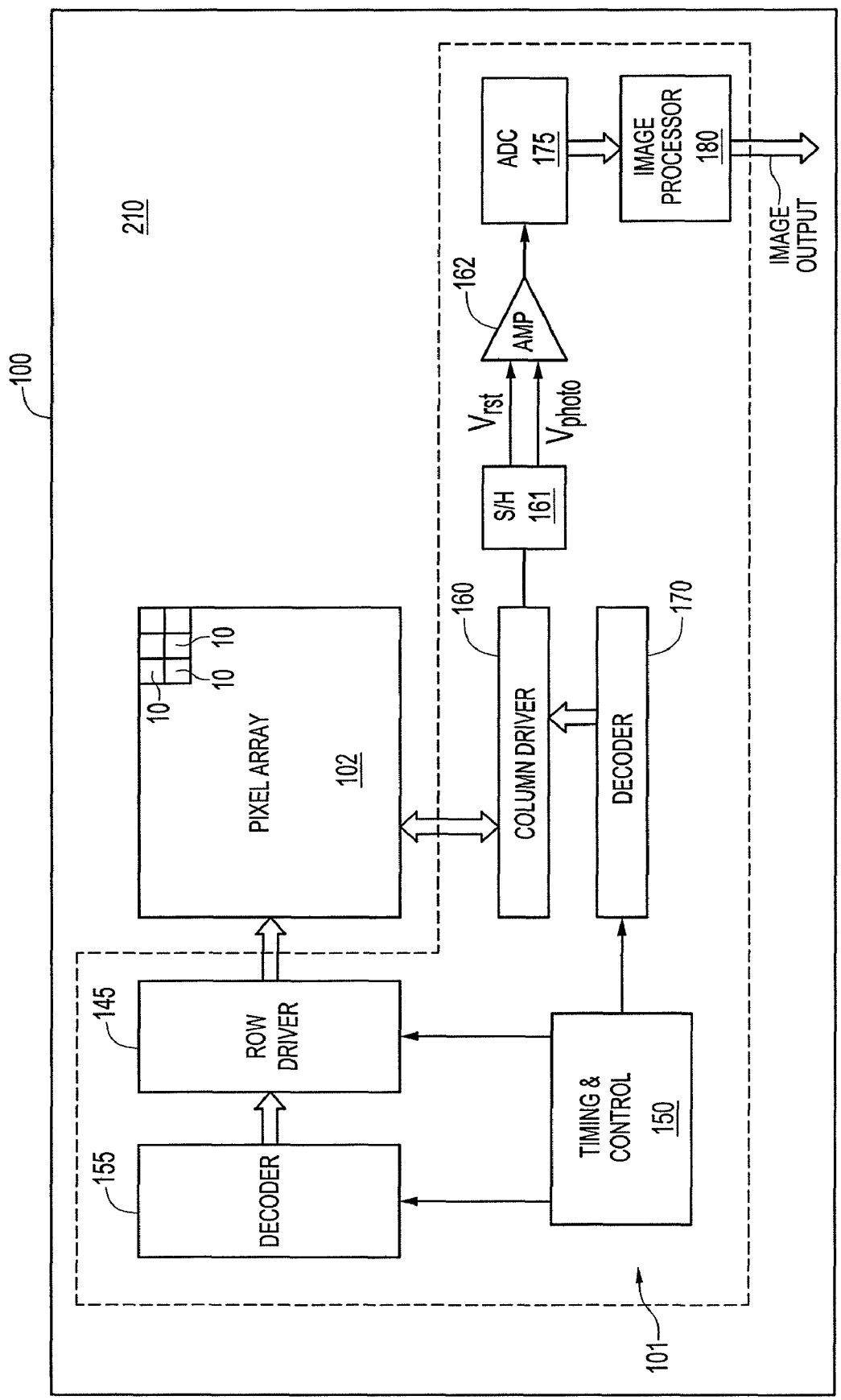
FIG. 1 is a block diagram of an image sensor according to an exemplary embodiment of the invention.

The invention is now explained with reference to the accompanying figures wherein like reference numbers are used consistently for like features throughout the drawings. FIG. 1 is a block diagram of a CMOS image sensor 100 that employs p and n-type gate structures formed in accordance with an exemplary embodiment of the invention. The image sensor 100 includes peripheral circuitry 101 and a pixel array 102, which includes a plurality of pixels 10. The peripheral circuitry 101 can be included on the same substrate 210 as the pixel array 102.

The peripheral circuitry 101 includes, for example, a row driver 145 and row address decoder 155. Row lines of the array 102 are selectively activated by the row driver 145 in response to row address decoder 155. A column driver 160 and column address decoder 170 are also included in the peripheral circuitry 101. The image sensor 100 is operated by the timing and control circuit 150, which controls the address decoders 155, 170. The control circuit 150 also controls the row and column driver circuitry 145, 160.

A sample and hold circuit 161 associated with the column driver 160 reads a pixel reset signal Vrst and a pixel image signal Vphoto for selected pixels of the array 102. A differential signal (Vrst-Vphoto) is produced by differential amplifier 162 for each pixel and is digitized by analog-to-digital converter 175 (ADC). The analog-to-digital converter 175 supplies the digitized pixel signals to an image processor 180 which forms and may output a digital image.

As described above, the peripheral circuitry 101 includes digital circuitry, e.g., image processor 180, and analog circuitry, e.g., sample and hold circuit 161 and amplifier 162. Digital circuitry of the image sensor 100 includes PMOS and NMOS surface channel devices and analog circuitry includes buried channel PMOS devices. Additionally, the image sensor 100 includes transistors having both p-type and n-type gates. Devices of the peripheral circuitry 101 are described in more detail below in connection with FIG. 4.

Figure 2:
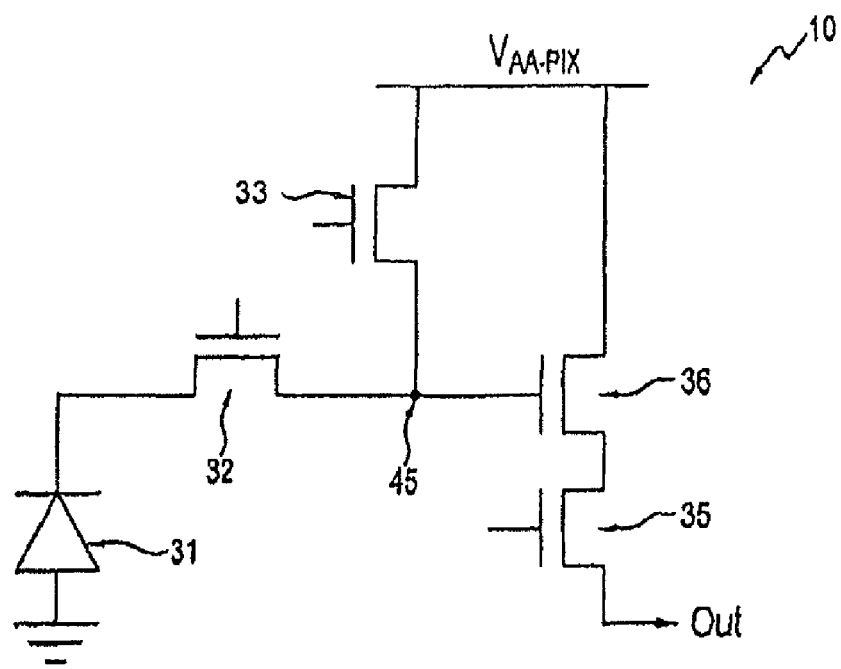
FIG. 2 is a schematic diagram of a pixel cell according to an exemplary embodiment of the invention.
Figure 3:
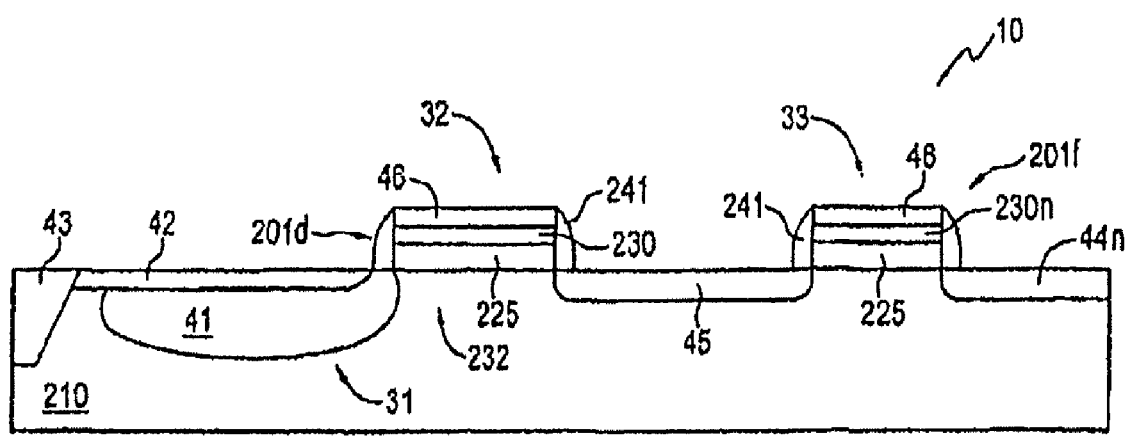
FIG. 3 is a cross sectional view of a portion of the pixel cell of FIG. 2.

FIGS. 2 and 3, depict a pixel cell 10 of the array 102. The pixel cell 10 functions by receiving photons of light and converting those photons into charge carried by electrons. For this, the pixel 10 includes a photodiode 31, or any type of photo-conversion device such as a photogate, photoconductor, or other photosensitive device. The photodiode 31 includes a photodiode charge accumulation region 41 and a p-type surface layer 42.

Each pixel cell 10 also includes a transfer transistor 32 for transferring charge from the photodiode photosensor charge accumulation region 41 to a floating diffusion region 45 and a reset transistor 33, for resetting the floating diffusion region 45 to a predetermined charge level Vaa-pix, prior to charge transfer. The pixel cell 10 also includes a source follower transistor 36 for receiving and amplifying a charge level from the floating diffusion region 45 and a row select transistor 35 for controlling the readout of the pixel cell 10 contents from the source follower transistor 36. The pixel 10 is isolated from other pixels of the array 102 and other devices of the image sensor 100 by isolation regions 43, which are depicted as shallow trench isolation regions.

In the illustrated embodiment, the transistors 32, 33 each include a gate stack 201d, 201f, respectively, supported by a substrate 210. The transfer transistor 32 and the reset transistor 33 may have different gate stack structures. In the illustrated embodiment, the substrate 210 is a p-type substrate. Each gate stack includes a plurality of layers including a gate oxide layer and a gate electrode. As shown in FIG. 3, the transfer transistor gate stack structure 201d includes a gate oxide 225 and a gate electrode 230. In the illustrated embodiment, the gate electrode 230 has substantially no active dopant concentration. The gate stack 201d further includes an insulating layer 46, which can be, for example, tetraethyl orthosilicate (TEOS), a silicon oxide ($SiO_2$), a nitride (e.g., silicon nitride), an oxynitride (silicon oxynitride), ON (oxidenitride), NO (nitride-oxide), or ONO (oxide-nitride-oxide). The insulating sidewalls 241, are comprised of, for example TEOS. The transfer transistor 32 also includes a channel region 232 underlying the gate oxide 225 and gate electrode 230.

As shown in FIG. 3, the reset transistor 33 includes a gate stack structure 201f. The gate stack structure 201f is similar to the gate stack structure 201d of the transfer transistor, except that the gate electrode 230n is doped n-type. The reset transistor 33 also includes a source/drain region 44n, which is an n-type region of the substrate 210.

Ideally, the transfer transistor 32 has a very low potential barrier during charge transfer from the photodiode 31 to the floating diffusion region 45. A low potential barrier increases the efficiency of the charge transfer from the photodiode 31 and minimizes lag by reducing or eliminating the potential well in the photodiode 31 when the transfer transistor 32 is operated. The electrical field between the transfer transistor 32 and the photodiode 31 is determined in large part by the dopant profile of the transfer transistor channel region 232 and the thickness of the gate oxide 225.

Ideally, the effective gate oxide 225 thickness is configured to vary with the voltage applied to the gate electrode 230. For example, when an n-type polysilicon gate electrode 230 is biased positive, the majority carriers (i.e., electrons) are depleted near the gate electrode 230/gate oxide 225 interface. This depletion is electrically equivalent to adding a dielectric layer where depletion has occurred, and therefore, effectively increases the thickness of the gate oxide layer 225. When the n-type gate electrode 230 is biased negative, the gate electrode 230/gate oxide 225 interface accumulates electrons, decreasing the effective gate oxide 225 thickness. Reducing the active dopant concentration of the gate electrode 230 or having substantially no active dopant concentration in the gate electrode 230 results in greater depletion.

In one exemplary embodiment, the gate electrode 230 is formed of polysilicon having substantially no active dopant concentration or having an active n-type dopant concentration equal to or lower than about $1 \times 10^{20}$ atoms/cm$^3$. Using a lower doped gate electrode 230 to configure the gate electrode 230 to be at least partially depleted during operation, results in an increase in the threshold voltage for the transistor 32. Therefore, a same threshold voltage as a more heavily doped gate electrode can be obtained using a lower active dopant concentration, e.g., lower p-type active dopant concentration, in the channel region 232. Such a reduction desirably reduces junction leakage and dark current.

Additionally, an increase in the effective gate oxide 225 thickness when the transfer transistor 32 is operated in full inversion reduces the peak electric field in the region from the photodiode 31 to the floating diffusion region 45. This desirably reduces gate-induced drain leakage, white-spot defects and tunneling-induced drain leakage.

In order to achieve an image sensor having high speed digital circuits, analog circuitry and pixel cells such as pixel cell 10 described above, it is desirable to form transistors having various operating characteristics and, thus, differing gate stack structures. FIG. 4 is a representative cross sectional view of different gate stack structures 201a-f that may be used for the various transistors employed to implement of the FIG. 1 image sensor 100. FIGS. 5A-5I depict an exemplary method for forming the structures 201a-f.

The image sensor 100 includes a plurality of different gate stack structures, but do not necessarily include all of the different gate stack structures 201a-f shown in FIG. 4. For example, one or more of the gate stack structures 201a-201f can be omitted from the image sensor 100 as described in more detail below.

Each gate stack structure 201a-201f is supported by a substrate 210 and includes a gate electrode and a gate oxide layer. Additional layers not shown can be added to one or more of the gate stack structures 201a-201f as desired. For example, an insulating layer can be formed over the gate electrode or a silicide layer may be added, among others.

The first gate stack structure 201a includes a thin gate oxide layer 221 in contact with the substrate 210. At least a portion 222 of the oxide layer 221 is nitrided. For simplicity, the oxide layer 221 is referred to as a nitrided oxide layer 221. An n-type gate electrode 230n overlies the nitrided oxide layer 221. The stack structures 201b and 201c are similar to structure 201a, except that stack structure 201b has a p-type gate electrode 230p and the gate electrode 230 of structure 201c has substantially no active dopant concentration. In the illustrated embodiment, the gate electrodes 230n and 230p are heavily doped to the respective conductivity types. Alternatively, structure 201c's gate electrode 230 can have an n-type dopant concentration of less than or equal to about $1 \times 10^{20}$ atoms/cm$^3$ or be a lightly doped p or n-type gate electrode.

Gate stack structure 201d includes a thick gate oxide layer 225 in contact with the substrate 210. In one embodiment, the gate oxide layer 225 is not nitrided. Alternatively, the gate oxide layer 225 can be partially nitrided, as discussed further below. A gate electrode 230 having substantially no dopant concentration overlies the oxide layer 225. Alternatively, the gate electrode 230 can have an n-type dopant concentration of less than or equal to about $1 \times 10^{20}$ atoms/cm$^3$ or be a lightly doped p-type gate electrode. Stack structures 201e and 201f are similar to structure 201d, except that stack structure 201e has a p-type gate electrode 230p and stack structure 201f has an n-type gate electrode 230p. In the illustrated embodiment, the gate electrodes 230n and 230p are heavily doped to the respective conductivity types. In one exemplary embodiment, the gates 230, 230n, 230p are polysilicon gates, however, other materials can be used, e.g., silicon-germanium.

Those of ordinary skill in the art will readily appreciate that the gate stack structures 201a-f can be used in a variety of devices in an integrated circuit, and within an image sensor 100. FIGS. 4B-4H depict exemplary devices 401a-401g, each including a respective gate stack structure 201a-201f.

Figure 4A:
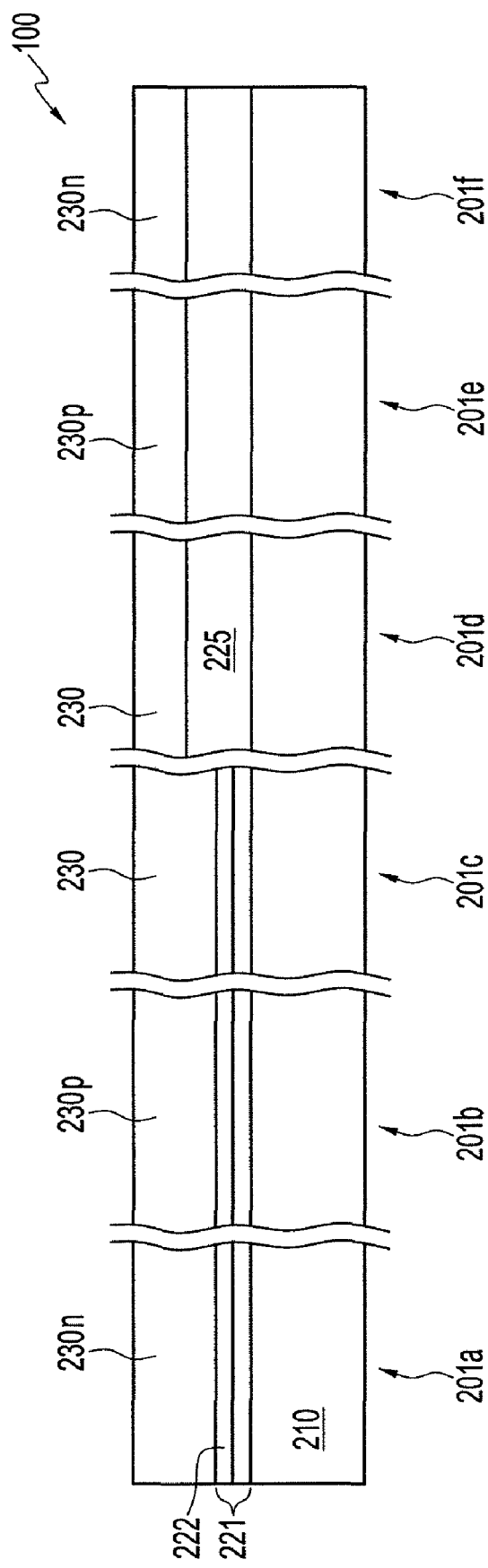
FIGS. 4A-4H are representative cross sectional view of portions of the image sensor of FIG. 1.
Figure 4B:
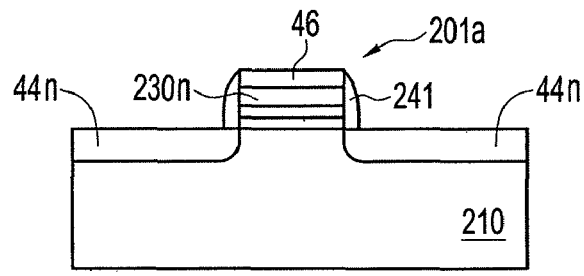

FIG. 4B depicts a transistor 401a including gate stack structure 201a. The transistor 401a further includes source/drain regions 44n, which are n-type regions. The transistor 401a is a surface channel NMOS transistor and can be located, for example in the peripheral circuitry 101 (FIG. 1).

Figure 4C:
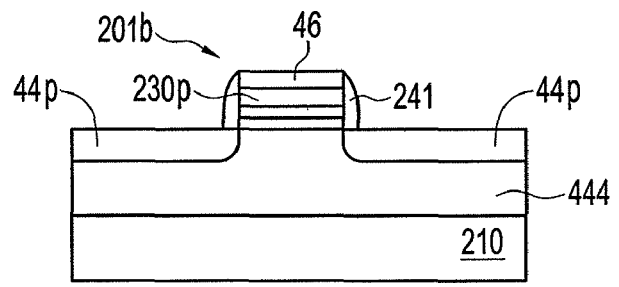

FIG. 4C depicts a transistor 401b including gate stack structure 201b. The transistor 401b further includes source/drain regions 44p, which are p-type regions. Additionally, the transistor 401b is formed in an n-well, which is an n-type region of the substrate 210. The transistor 401a is a surface channel PMOS transistor and can be located, for example in the peripheral circuitry 101.

Figure 4D:
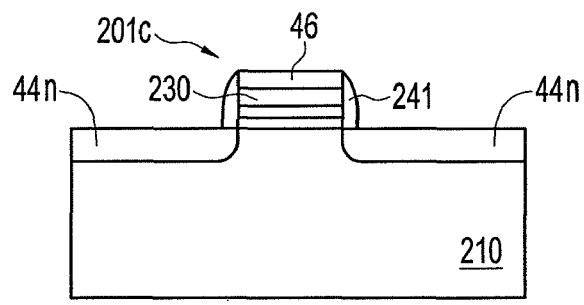

FIG. 4D depicts a transistor 401c including gate stack structure 201c. The transistor 401c further includes source/drain regions 44n. The transistor 401a is a surface channel NMOS transistor and can be located, for example in the peripheral circuitry 101 (FIG. 1). Alternatively, the gate stack structure could be used to form a surface channel PMOS transistor. In such a case, the source/drain regions 44n would be p-type regions 44p and the transistor would be formed in an n-well (e.g., n-well 444 (FIG. 4C).

Figure 4E:
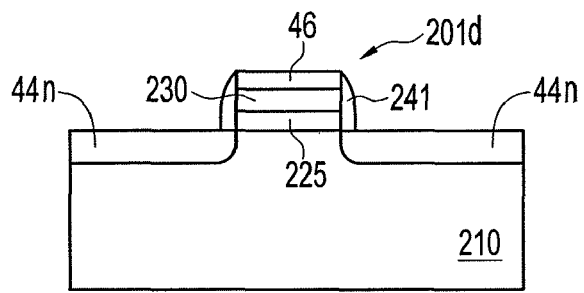

FIG. 4E depicts a transistor 401d including gate stack structure 201d. The transistor 401d further includes source/drain regions 44n, which are n-type regions. The transistor 401d is a surface channel NMOS transistor and can be located, for example in the array 102 (FIG. 1), and specifically can be the transfer transistor 32 of a pixel 10 as shown in FIG. 3.

Figure 4F:
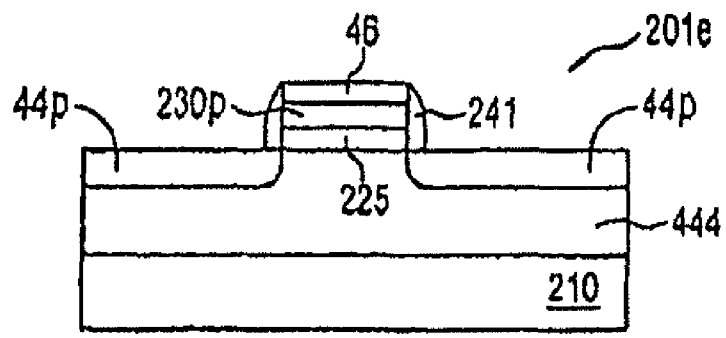

FIG. 4F depicts a transistor 401e including gate stack structure 201e. The transistor 401e further includes source/drain regions 44p and is formed in an n-well 444. The transistor 401e is a surface channel PMOS transistor and can be located, for example in the array 102 (FIG. 1). Also, if in pixel 10 an npn-type photodiode is used rather than the pnp-type photodiode shown in FIG. 3, the conductivity types of the pixel 10 devices would change accordingly. In such a case, the transistor 401e can be used in the pixel 10, for example, as the reset transistor 33.

Figure 4G:
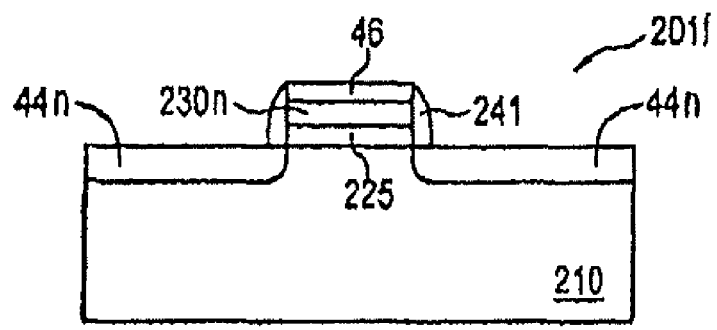

FIG. 4G depicts a transistor 401f including gate stack structure 201f. The transistor 401f further includes source/drain regions 44n. The transistor 401d is a surface channel NMOS transistor and can be located, for example in the array 102 (FIG. 1), and specifically can be the reset transistor 33 of a pixel 10 as shown in FIG. 3.

Figure 4H:
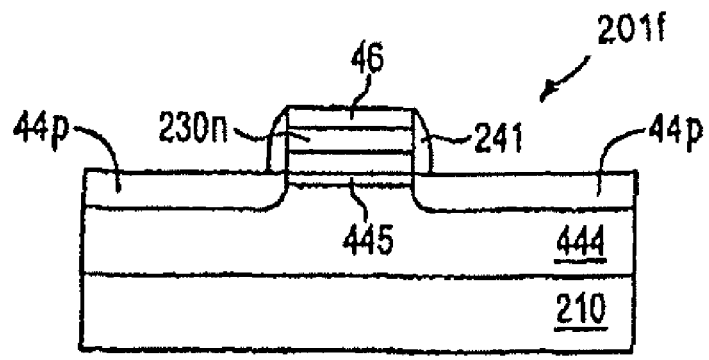

FIG. 4H depicts a transistor 401g including gate stack structure 201f. The transistor 401g further includes source/drain regions 44p and is formed in a p-well 444. Additionally the channel region of the transistor 401g includes a p-type layer 445. The transistor 401g is a buried channel PMOS transistor, which can, for example, be included in analog circuitry of the image sensor 100, particularly circuitry sensitive to noise.

The transistors 401a-g are exemplary only and the gate stack structures 201a-f can be included in other devices and other integrated circuits, for example, in a gated capacitor of a CCD-type image sensor. Thus, one of ordinary skill in the art would readily recognize that the examples provided herein and are not limiting. If desired, one or more of the gate stack structures 201a-f and, therefore, transistors 401a-g can be omitted from the image sensor 100. For example, if desired only gate stack structure 201f can be used in the array 102 and/or gate stack structure 201c can be omitted from the peripheral circuitry 101.

FIGS. 5A-5I depict an exemplary method for forming the gate stack structures 201a-f on a same substrate 210. As noted above, not all of the gate stack structures 201a-f must be formed. For simplicity, the method for forming all structures 201a-f is described, but, if fewer structures 201a-f are desired, certain processing steps can be eliminated as described in more detail below.

Figure 5A:
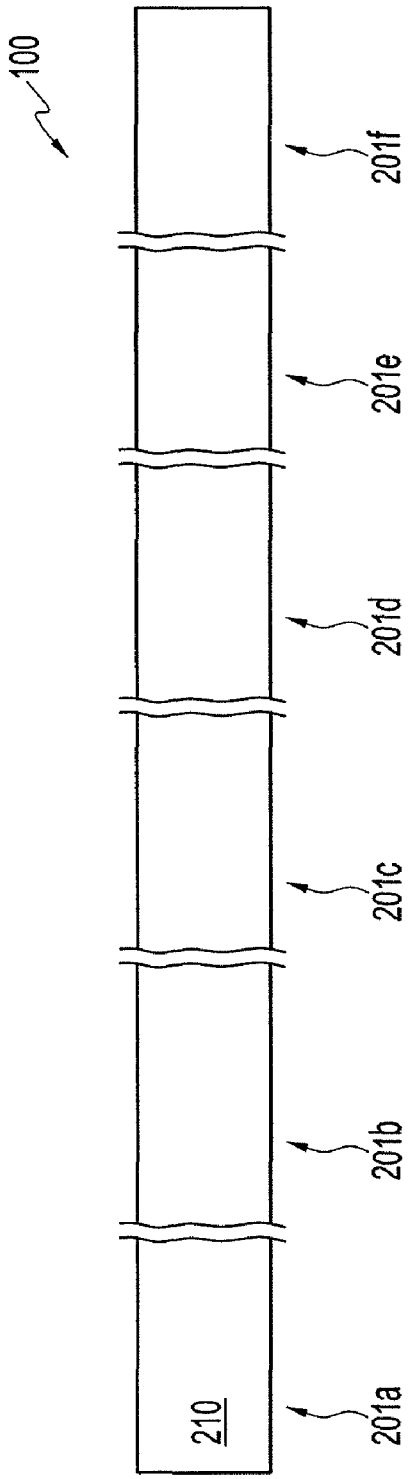

Referring to FIG. 5A, the substrate 210 is initially provided. Processing steps to form structures such as p-type and n-type wells, isolation regions, such as shallow trench isolation regions 43 (FIG. 3), or other structures as desired can be performed prior to forming the gate stack structures 201a-f.

Figure 5B:
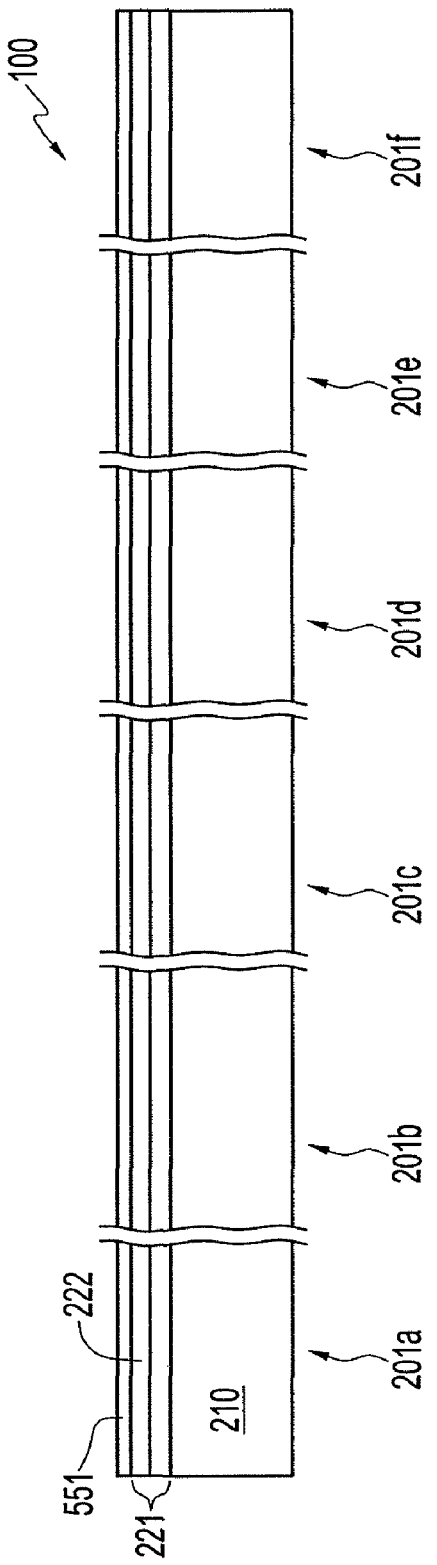

As shown in FIG. 5B, a blanket oxide layer 221 is grown on the substrate 210. In the illustrated embodiment, the oxide layer 221 is formed having a thickness between about 10 Å and about 30 Å, although other thicknesses can be used (if desired). Nitrogen is added to the oxide layer 221 by, for example, a decoupled plasma nitridation step according to known techniques. The resulting nitrogen concentration of the oxide layer 221 is preferably between about 20 atomic percent and about 30 atomic percent. Other processes for forming a nitrided oxide layer can instead be used. For example, the nitrided oxide layer 221 can be prepared by thermal nitridation. A sacrificial TEOS layer 551 is formed over the nitrided oxide layer 221.

A photoresist mask 552 is formed and patterned over portions of the substrate 210 where gate stack structures 201a-c are to be formed, as shown in FIG. 5C. The sacrificial TEOS layer 551 and nitrided oxide layer 221 are removed from portions of the substrate where gate stack structures 201d-f are to be formed, as depicted in FIG. 5D. The removal of layers 552, 551 and 221 can be accomplished by etching the TEOS layer 551 and oxide layer 221 by known techniques. For example, after the photoresist 552 is selectively developed in the desired pattern, a buffered oxide etch can be used to remove the developed photoresist 552. A hot phosphoric acid etch followed by a dilute hydrogen fluoride etch or buffered oxide etch to remove the TEOS layer 551 and nitrided oxide layer 221.

Figure 5E:
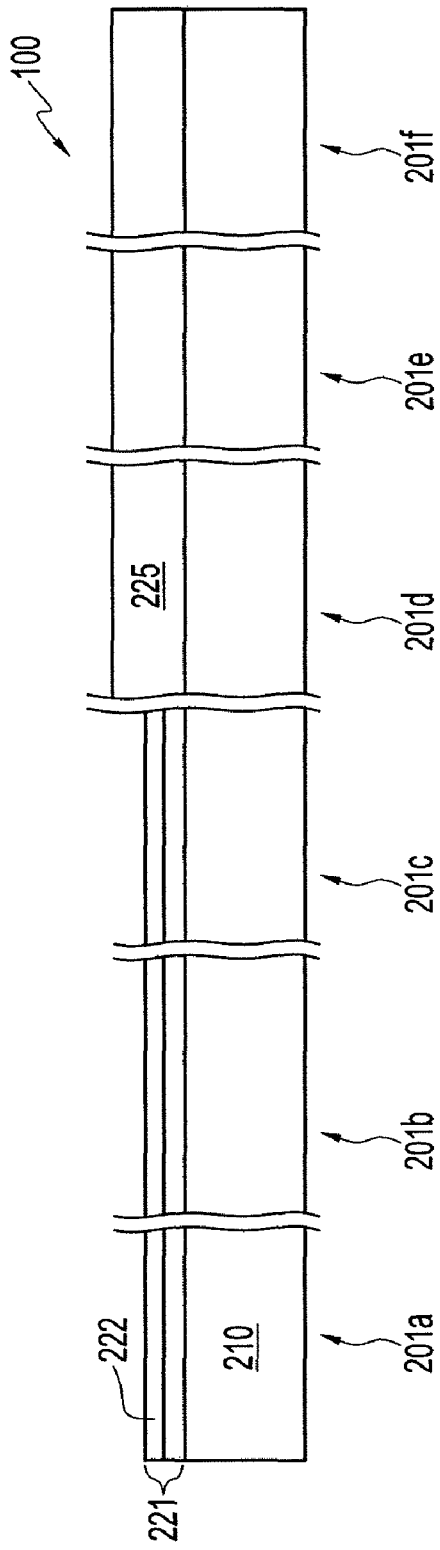

As shown in FIG. 5E, the remaining photoresist 552 and TEOS layer 551 are removed by known techniques. An oxide layer 225 is grown on the exposed portions of the substrate 210 and specifically where the gate stack structures 201d-f are to be formed. In the illustrated embodiment, the gate oxide layer 225 is thicker than the nitrided oxide layer 221. For example, the oxide layer 225 can have a thickness between about 20 Å and about 100 Å, although other thicknesses can be used (if desired).

Figure 5F:
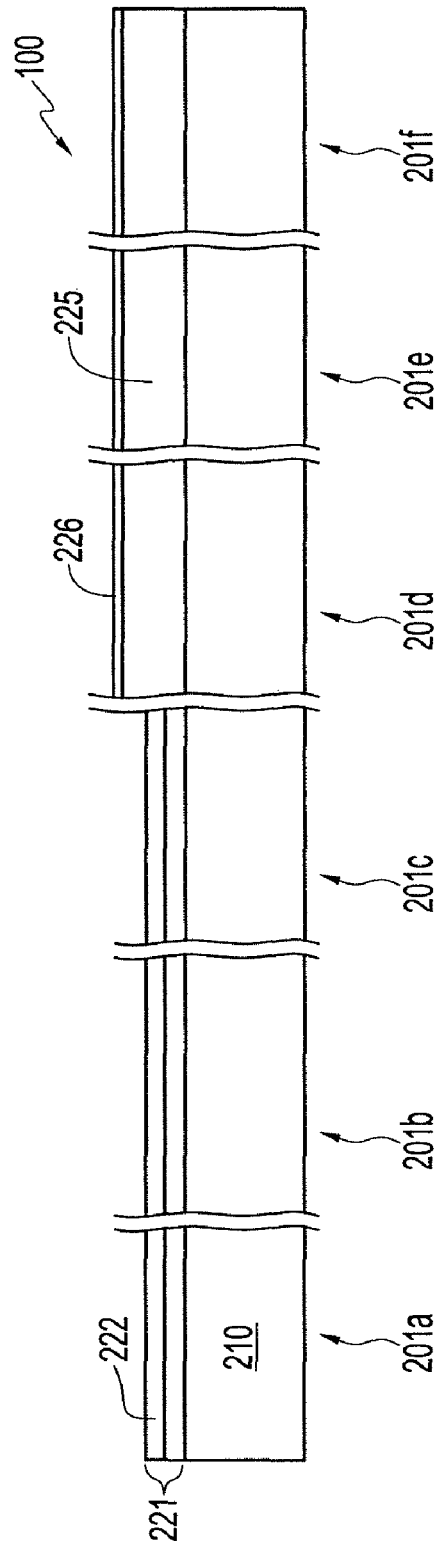

Optionally, as illustrated in FIG. 5F, the oxide layer 225 can also include nitrogen. In the illustrated example, the nitrided portion 226 is shown at the surface of layer 225. Desirably, the nitrogen concentration of the layer 225 is less than or equal to about 10 atomic percent. The "partially nitrided" layer 225 can be formed by known techniques, for example a reduced power decoupled plasma nitridation step or thermal nitridation. For simplicity, oxide layer 225 is depicted as having substantially no nitrogen concentration in other figures.

Figure 5G:
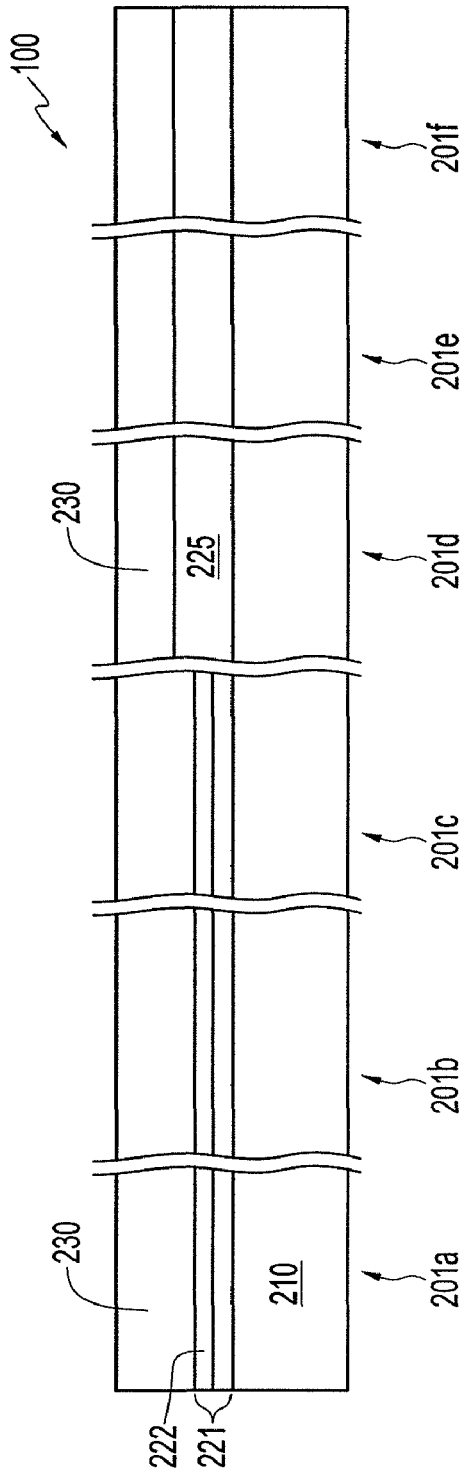

As shown in FIG. 5G, a gate electrode layer 230 is formed over the substrate 210 and layers 221, 225 and planarized, for example by a chemical mechanical polish step. The gate electrode layer 230 is an amorphous un-doped polysilicon layer in the illustrated embodiment. Alternatively, the gate electrode can be a low-doped n-type polysilicon layer having an n-type active dopant concentration of less than or equal to about $1 \times 10^{20}$ atoms/cm$^3$. Alternatively, the gate electrode 230 can be formed of a different material, such as silicon-germanium, which can be undoped or doped n-type.

Figure 5H:
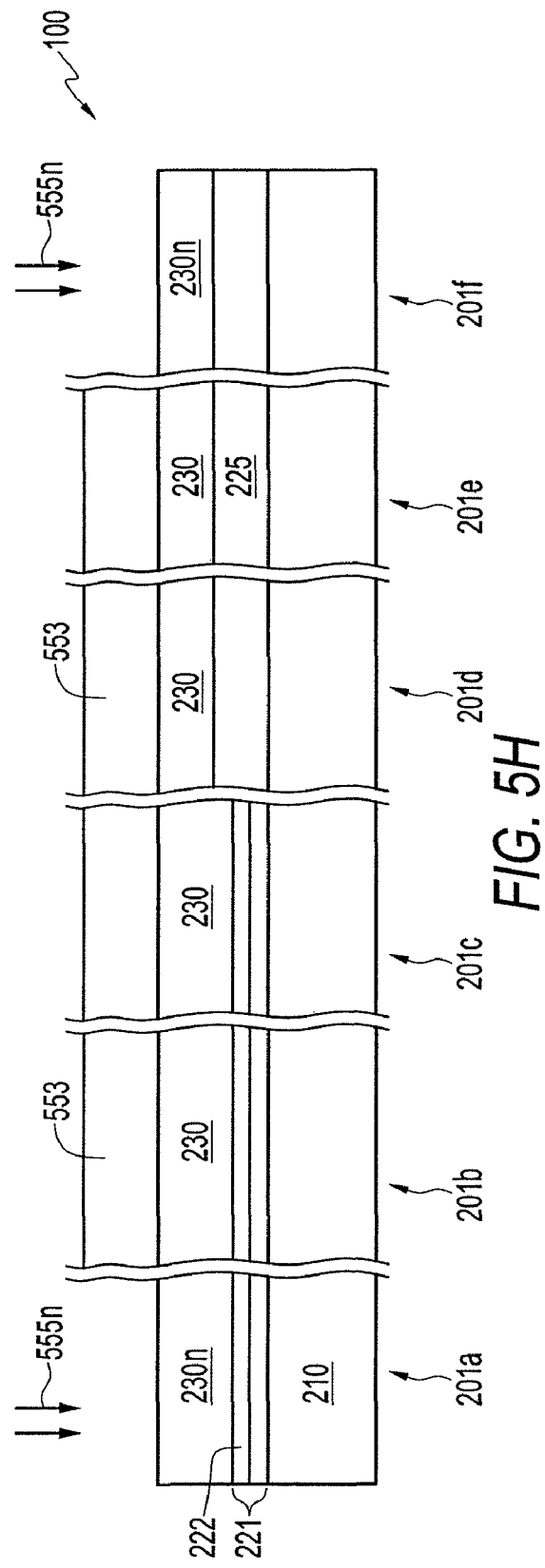

Referring FIG. 5H, a photoresist mask 553 is formed and patterned to be over portions of the substrate 210 where gate stack structures 201b-e are to be formed. n-type dopants are then implanted into the gate electrode layer 230 to form heavily doped gate electrodes 230n for gate stack structures 201a and 201f. The active dopant concentration in the gate electrodes 230n can be, for example, greater than or equal to about $1 \times 10^{20}$ atoms/cm$^3$. The photoresist mask 553 is then removed. Additional implants (not shown) to create threshold voltage adjustments and p-wells can also be conducted after the removal of the mask 553.

Referring FIG. 5I, a photoresist mask 554 is formed and patterned to be over portions of the substrate 210 having gate stack structures 201a, 201c, 201d, and 201f. p-type dopants are implanted into the gate electrode layer 230 to form heavily doped p-type gate electrodes 230p for gate stack structures 201b and 201e. The active dopant concentration in the gate electrodes 230p can be, for example, greater than or equal to about $1 \times 10^{20}$ atoms/cm$^3$. The photoresist mask 554 is then removed.

If fewer than all of gate stack structures 201a-f are to be formed, certain processing steps described above can be omitted or modified to obtain only the desired structures 201a-f. For example, if structure 201c is to be omitted, the processing steps described in connection with FIGS. 5H and 5I can be modified such that all remaining portions of the conductive layer 230 over the nitrided oxide layer 221 are doped p or n-type. Likewise, if structures 201d and 201e are to be omitted, the processing steps described in connection with FIGS. 5H and 5I can be modified such that all remaining portions of the conductive layer 230 over the oxide layer 225 are doped n-type.

Other layers to be included in the gate stack structures 201a-f can be formed as desired by conventional techniques. For example, for gate stack structures of pixels 10, insulating layer 46 and sidewalls 241 can be formed. The gate stack structures 201a-f can then be patterned as desired. Additionally, conventional processing methods are used to form other structures the peripheral circuitry 101 and array 102. For example, photodiode 31, floating diffusion region 45, source/drain regions for transistors, shielding for pixels 10 and metallization layers to form connections of the image sensor 100, among others are formed.

Figure 6:
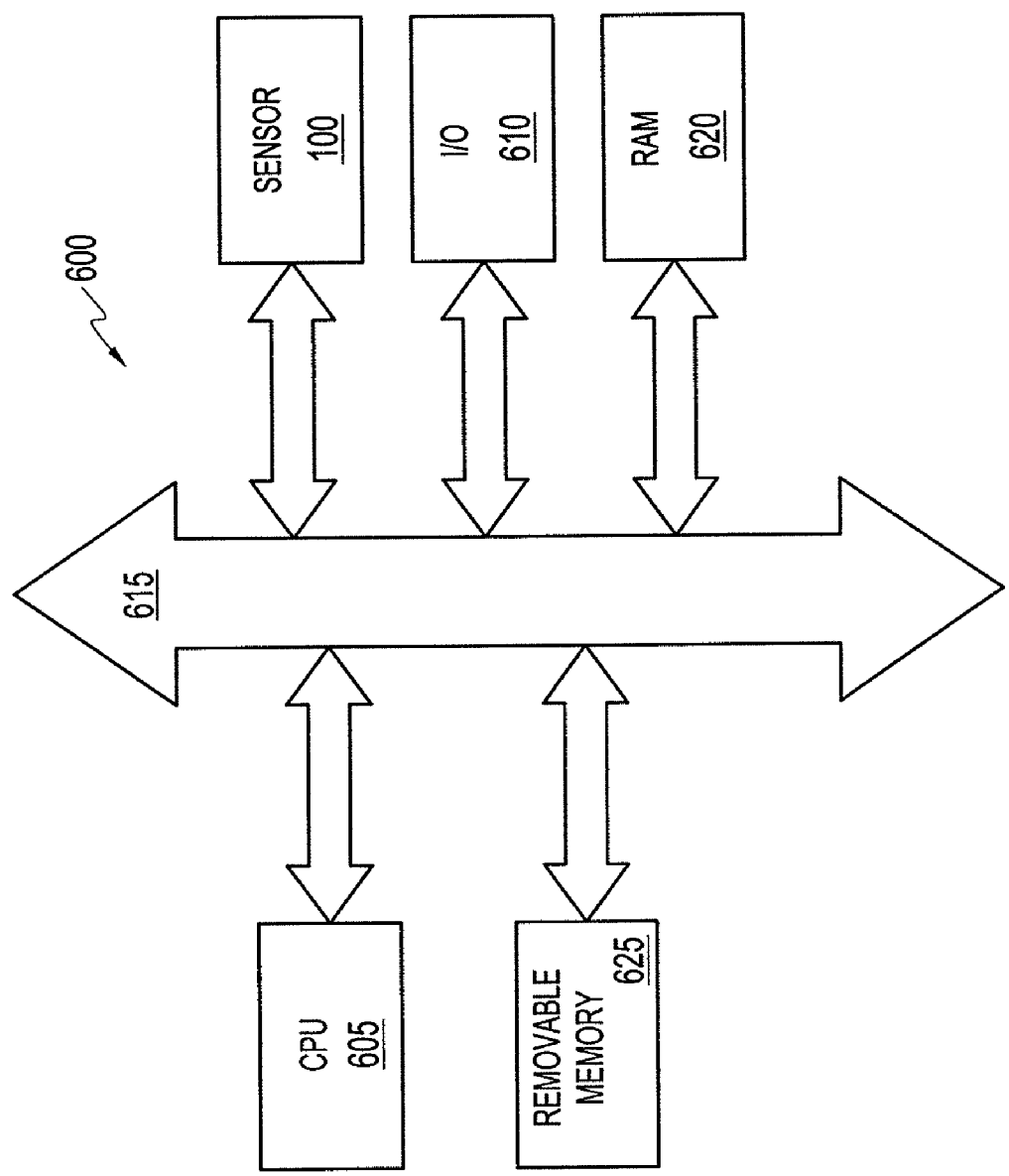
FIG. 6 is a block diagram of a processor system including the image sensor of FIG. 1.

FIG. 6 illustrates a processor system 600 including an image sensor 100 of FIG. 1 containing two or more of the FIG. 4B-4H transistors formed according to the method described in connection with FIGS. 5A-5I. The processor-based system 600 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other image acquisition and processing system.

The processor system 600, for example a camera system, generally comprises a central processing unit (CPU) 605, such as a microprocessor, that communicates with an input/output (I/O) device 610 over a bus 615. Image sensor 100 also communicates with the CPU 605 over bus 615. The processor system 600 also includes random access memory (RAM) 620, and can include removable memory 625, such as flash memory, which also communicates with CPU 605 over the bus 615. Image sensor 100 may be combined with a processor, such as a CPU, digital signal processor, or microprocessor, with or without memory storage on a single integrated circuit or on a different chip than the processor.

If desired, additional integrated circuit devices of the system 600 can include p and n-type gates formed according to an exemplary embodiment of the invention. For example, RAM 620 and or CPU 605 can include two or more of the gate stack structures 201a-f formed according to an exemplary embodiment of the invention.

It is again noted that the above description and drawings are exemplary and illustrate preferred embodiments that achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. An image sensor comprising:
   peripheral circuitry comprising:
   PMOS devices having a gate stack structure comprising a first nitrided gate oxide layer and a p-type gate electrode, and
   NMOS devices having a gate stack structure comprising a second nitrided gate oxide layer and an n-type gate electrode; and
   an array of pixels adjacent said peripheral circuitry, at least one pixel comprising:
   a photo-conversion device, and
   a first transistor for transferring charge from the photo-conversion device, the first transistor having a gate stack comprising a pixel gate oxide layer having less than or equal to about 15 atomic percent nitrogen concentration and a pixel gate electrode.

2. The image sensor of claim 1, wherein the first and second nitrided gate oxide layers are different than the pixel gate oxide layer.

3. The image sensor of claim 1, wherein the thickness of at least one of the first and second nitrided gate oxide layers is between about 10 Å and about 30 Å.

4. The image sensor of claim 1, wherein the thickness of the pixel gate oxide layer is between about 20 Å and about 100 Å.

5. The image sensor of claim 1, wherein the pixel gate electrode has an active dopant concentration of less than or equal to about $1 \times 10^{20}$ atoms/cm$^3$.

6. The image sensor of claim 1, wherein the pixel gate electrode has substantially no active dopant concentration.

7. The image sensor of claim 1, wherein the pixel gate oxide layer has substantially no nitrogen concentration.

8. The image sensor of claim 1, wherein the peripheral circuitry comprises digital and analog circuitry.

9. An image sensor comprising:
   a processor coupled to an image sensor, the image sensor comprising:
   peripheral circuitry comprising:
   PMOS devices having a gate stack structure comprising a first nitrided gate oxide layer and a p-type gate electrode, and
   NMOS devices having a gate stack structure comprising a second nitrided gate oxide layer and an n-type gate electrode; and
   an array of pixels at least one pixel comprising:
   a photo-conversion device,
   a transistor used in operation of said pixel, said transistor having first gate stack comprising a gate oxide layer and a gate electrode.

10. The image sensor of claim 9, wherein the image sensor is a CMOS image sensor.

11. The image sensor of claim 9, wherein the image sensor is a charge coupled device image sensor.

12. The image sensor of claim 9, wherein the pixel gate oxide layer has less than or equal to about 15 atomic percent nitrogen concentration.

13. The image sensor of claim 9, wherein the first and second nitrided gate oxide layers are different than the pixel gate oxide layer.

14. The image sensor of claim 9, wherein the thickness of at least one of the first and second nitrided gate oxide layers is between about 10 Å and about 30 Å.

15. The image sensor of claim 9, wherein the thickness of the pixel gate oxide layer is between about 20 Å and about 100 Å.

16. The image sensor of claim 9, wherein the pixel gate electrode has an active dopant concentration of less than or equal to about $1 \times 10^{20}$ atoms/cm$^3$.

17. The image sensor of claim 9, wherein the pixel gate electrode has substantially no active dopant concentration.

18. The image sensor of claim 9, wherein the pixel gate oxide layer has substantially no nitrogen concentration.

19. The image sensor of claim 9, wherein the peripheral circuitry comprises digital and analog circuitry.

20. An integrated circuit comprising:
   at least one first gate stack structure for at least one first device, the at least one first gate stack structure comprising a nitrided first gate oxide layer and a first conductive layer of a first conductivity type;
   at least one second gate stack structure for at least one second device, the at least one second gate stack structure comprising a nitrided second gate oxide layer and a second conductive layer of a second conductivity type; and
   at least one third gate stack structure for at least one third device, the at least one third gate stack structure comprising a third gate oxide layer and a third conductive layer wherein the third gate electrode is of the first conductivity type and further comprising at least one fourth gate stack structure for at least one fourth device, the at least one fourth gate stack structure comprising a fourth gate oxide layer and a fourth conductive layer of the second conductivity type.

21. The integrated circuit of claim 20, wherein the third gate oxide layer has less than or equal to about 15 atomic percent nitrogen concentration.

22. The integrated circuit of claim 20, wherein the nitrided first and second gate oxide layers are different than the third gate oxide layer.

23. The integrated circuit of claim 20, wherein the third gate electrode has an active dopant concentration of less than or equal to about $1 \times 10^{20}$ atoms/cm$^3$.

24. The integrated circuit of claim 20, further comprising at least one fifth gate stack structure for at least one fifth device, the at least one fifth gate stack structure comprising a fifth gate oxide layer and a fifth conductive layer having an active dopant concentration less than that of the third and fourth conductive layers.

25. The integrated circuit of claim 24, further comprising at least one sixth gate stack structure for at least one sixth device, the at least one sixth gate stack structure comprising a sixth gate oxide layer and a sixth conductive layer having an active dopant concentration less than that of the first and second conductive layers.

26. An integrated circuit comprising:
at least one first gate stack structure for at least one first device, the at least one first gate stack structure comprising a nitrided first gate oxide layer and a first conductive layer of a first conductivity type;
at least one second gate stack structure for at least one second device, the at least one second gate stack structure comprising a nitrided second gate oxide layer and a second conductive layer of a second conductivity type;
at least one third gate stack structure for at least one third device, the at least one third gate stack structure comprising a third gate oxide layer and a third conductive layer; and
at least one fourth gate stack structure for at least one fourth device, the at least one fourth gate stack structure comprising a nitrided fourth gate oxide layer and a fourth conductive layer having an active dopant concentration less than that of the first and second conductive layers.

* * * * *